United States Patent
Matsuo et al.

(10) Patent No.: US 11,067,892 B2
(45) Date of Patent: Jul. 20, 2021

(54) PHOTOSENSITIVE CTP FLEXOGRAPHIC PRINTING ORIGINAL PLATE

(71) Applicant: TOYOBO CO., LTD., Osaka (JP)

(72) Inventors: Keisuke Matsuo, Otsu (JP); Hiromichi Yonekura, Otsu (JP)

(73) Assignee: TOYOBO CO., LTD., Osaka (JP)

(*) Notice: Subject to any disclaimer, the term of this patent is extended or adjusted under 35 U.S.C. 154(b) by 125 days.

(21) Appl. No.: 16/498,147

(22) PCT Filed: Jan. 12, 2018

(86) PCT No.: PCT/JP2018/000683
§ 371 (c)(1),
(2) Date: Sep. 26, 2019

(87) PCT Pub. No.: WO2018/179674
PCT Pub. Date: Oct. 4, 2018

(65) Prior Publication Data
US 2020/0073242 A1 Mar. 5, 2020

(30) Foreign Application Priority Data
Mar. 31, 2017 (JP) .............................. JP2017-070472

(51) Int. Cl.
*G03F 7/20* (2006.01)
*G03F 7/095* (2006.01)
*G03F 7/037* (2006.01)

(52) U.S. Cl.
CPC .............. *G03F 7/095* (2013.01); *G03F 7/037* (2013.01); *G03F 7/202* (2013.01)

(58) Field of Classification Search
CPC ........................................................ G03F 7/20
See application file for complete search history.

(56) References Cited

U.S. PATENT DOCUMENTS

| 5,262,275 A | 11/1993 | Fan |
| 5,688,632 A | 11/1997 | Kashio et al. |
| 2012/0111211 A1* | 5/2012 | Yawata .................. G03F 7/202 101/395 |

FOREIGN PATENT DOCUMENTS

| JP | 7-84370 A | 3/1995 |
| JP | 7-506201 A | 7/1995 |
| JP | 2009-288700 A | 12/2009 |
| JP | 2009-300588 A | 12/2009 |
| JP | 2010-26036 A | 2/2010 |
| JP | 2010-276916 A | 12/2010 |
| JP | 2012-137515 A | 7/2012 |
| JP | 2013-178428 A | 9/2013 |
| JP | 2016-188900 A | 11/2016 |
| WO | 94/03838 A1 | 2/1994 |
| WO | 2010-150844 A1 | 12/2010 |

OTHER PUBLICATIONS

International Search Report dated Apr. 3, 2018, issued in counterpart International Application No. PCT/JP2018/000683, with English Translation. (4 pages).
Notification of Transmittal of Translation of the International Preliminary Report on Patentability (Form PCT/IB/338) issued in counterpart International application No. PCT/JP2018/000683 dated Oct. 10, 2019 with Forms PCT/IB/373 and PCT/ISA/237. (6 pages).

* cited by examiner

*Primary Examiner* — Chanceity N Robinson
(74) *Attorney, Agent, or Firm* — Westerman, Hattori, Daniels & Adrian, LLP

(57) ABSTRACT

The present invention aims to provide a CTP flexographic printing original plate having such high performances that, even under a severe low-temperature condition of 10° C. or lower, no crack is generated in a heat-sensitive mask layer and further that, even when the heat-sensitive mask layer is formed as a thin film, no unevenness is generated in an optical density in transmission. A photosensitive CTP flexographic printing original plate, characterized in that, it comprise at least a support, a photosensitive resin layer and a heat-sensitive mask layer which are sequentially layered, that the heat-sensitive mask layer contains a methoxymethylated polys side resin (A) and a water-soluble polyamide resin (B) containing a basic nitrogen atom in a molecule, and that a glass transition point of the polyimide resin (A) is 0° C. to 30° C.

4 Claims, No Drawings

PHOTOSENSITIVE CTP FLEXOGRAPHIC PRINTING ORIGINAL PLATE

TECHNICAL FIELD OF THE INVENTION

The present invention relates to a photosensitive CTP flexographic printing original plate to be used for producing a relief printing plate according to a Computer to Plate Technique. More particularly, the present invention relates to a photosensitive CTP flexographic printing original plate having a heat-sensitive mask layer which generates no crack even during a handling operation at a low temperature.

BACKGROUND ART

In recent years, in a field of flexographic printing, a Computer to Plate Technique (CTP Technique), known as a digital image-forming technique, has been widely used as a general technique. The CTP technique is a method wherein information processed on a computer is directly outputted onto a printing plate so that a concave/convex pattern to form a relief is obtained. This technique eliminates a necessity of a step for producing a negative film, thereby making it possible to reduce cost and time required for forming the negative film.

In a CTP technique, the conventionally used negative film for covering an area being not to be photopolymerized has been substituted with a mask which is formed and integrated within a printing plate. As to a method for preparing this integrated mask, there has been widely used a method wherein an infrared-sensitive layer (heat-sensitive mask layer) which is opaque to a chemical ray is formed on a photosensitive resin layer and then this infrared-sensitive layer is evaporated using an infrared laser whereupon an image mask is formed (cf. Patent Document 1).

As to the heat-sensitive mask layer, that consisting of carbon black (a material which does not transmit any radiation) and a binder has been commonly used. The heat sensitive mask layer is ablated by the infrared laser. Therefore, the heat-sensitive mask layer is preferred to be in a thin film in view of ablation efficiency. In addition, when the film is thinner, an influence of wrinkles on the relief is also less. However, the heat-sensitive mask layer is usually demanded to have an optical density (light-shielding property) in transmission of 2.0 or more in order to inhibit transmission of the chemical radiation onto the photopolymerization layer.

In a CTP plate, a heat-sensitive mask wherein carbon black is dispersed into a film-formable binder polymer is commonly used. However, dispersibility of the carbon black into the binder polymer is poor. Accordingly, there is a problem of causing unevenness in the optical density in transmission. Therefore, there is a problem that, although the heat-sensitive mask layer is preferred to be thin in view of the ablation efficiency, it is not possible to make the heat-sensitive mask layer thin.

With regard to the problem of unevenness of the optical density in transmission, Patent Document 2 discloses that, by using a binder polymer being excellent in the dispersibility of carbon black, the unevenness of the optical density in transmission can be made small even when the heat-sensitive mask is made into a thin film.

On the other hand, in the CTP flexographic printing original plate, there is a problem that cracks are apt to be generated in the heat-sensitive mask layer when a bending force is applied to the printing original plate during a handling operation for detaching the printing original plate from an ablation device. As to the problem of cracks, Patent Document 3 discloses that a flexing resistance is improved and the cracks in the heat-sensitive mask layer can be prevented when a synthetic rubber component in the photosensitive resin layer is contained in the heat-sensitive mask layer. Patent Document 4 discloses that the cracks can be suppressed when a rubber component in the photosensitive res in layer is compounded with an acrylic resin having a glass transition temperature (Tg) of 48 to 85° C.

Recently, the CTP flexographic printing original plate is becoming a main plate-making technique in place of an analog plate using the negative film. As a result, the CTP flexographic printing original plate is now being treated under a condition of low temperature and low humidity in wintertime whereby troubles are becoming to happen. Thus, there may be such cases wherein the handling operation is done immediately after the CTP flexographic printing original plate is taken out from storehouses in wintertime. In this case, the printing original plate is used in a state wherein it is still at a temperature of 10° C. or even lower. It is the current status that, in the handling operation under such severe low-temperature condition, generation of cracks still cannot be prevented even by the means disclosed in Patent Documents 3 and 4.

PRIOR ART DOCUMENTS

Patent Documents

Patent Document 1: Japanese Patent Application Laid-Open (JP-A) No. 506201/95
Patent Document 2: Japanese Patent Application Laid-Open (JP-A) No. 2009-300588
Patent Document 3: Japanese Patent Application Laid-Open (JP-A) No. 2009-288700
Patent Document 4: Japanese Patent Application Laid-Open (JP-A) No. 2012-137515

DISCLOSURE OF THE INVENTION

Problem that the Invention is to Solve

The present invention has been created in view of the above-mentioned current status of the prior art. An object of the present invention is to provide a CTP flexographic printing original plate wherein no crack is generated in a heat-sensitive mask layer even when a bending force is applied to the printing original plate during a handling operation of the printing original plate. Especially, the object of the present invention is to provide a CTP flexographic printing original plate having such high performances that no crack is generated in a heat-sensitive mask layer even under the severe low-temperature condition of 10° C. or lower acid further that, even when the heat-sensitive mask layer is formed as a thin film, no unevenness is generated in the optical density in transmission.

Means for Solving the Problem

The inventors have conducted eager studies for achieving the above object. As a result, they found that, when two kinds of polyamide resins which are a methoxymethylated polyamide resin (A) having a specific low glass transition point (Tg) and a water-soluble polyamide resin (B) containing a basic nitrogen atom in a molecule are used in combination as the binder polymers for the heat-sensitive mask layer, it is now possible to effectively prevent the cracks in the heat-sensitive mask layer under the severe low-temperature condition and further to effectively prevent the unevenness in the optical density in transmission when the heat-sensitive mask layer is formed as the thin film whereupon they have accomplished the present invention.

Thus, the present invention has the constitutions of the following (1) to (4).

(1) A photosensitive CTP flexographic printing original plate, characterized in that, it comprises at least a support, a photosensitive resin layer and a heat-sensitive mask layer which are sequentially layered, that the heat-sensitive mask layer contains a methoxymethylated polyamide resin (A) and a water-soluble polyamide resin (B) containing a basic nitrogen atom in a molecule, and that a glass transition point of the polyamide resin (A) is 0° C. to 30° C.

(2) The photosensitive CTP flexographic printing original plate according to (1), wherein the methoxymethylated polyamide resin (A) is an aliphatic polyamide resin, and wherein a methoxymethylated rate thereof is 15 to 45 molar % to a total amount of nitrogen atoms in an amide group.

(3) The photosensitive CTP flexographic printing original plate according to (1) or (2), wherein a rate of the methoxymethylated polyamide resin (A) to the water-soluble polyimide resin (B) in the heat-sensitive mask layer is within a range of from 40/60 to 90/10 in terms of a ratio by mass of [polyamide resin (A)]/[polyamide resin (B)].

(4) The photosensitive CTP flexographic printing original plate according to any of (1) to (3), wherein the polyamide resin (B) is a copolymerized polyamide containing a piperazine ring in a molecule, and wherein a glass transition point of the polyamide resin (B) is 30 to 60° C.

Advantages of the Invention

In accordance with the present invention, it is now possible, by means of the combined use of the above two kinds of specific polyamide resins in the heat-sensitive mask layer, to provide a CTP flexographic printing original plate having such high performances that, even under the severe condition wherein a surface temperature of the CTP flexographic printing original plate is 10° C. or even lower, no crack is generated in the heat-sensitive mask layer during the handling operation and further that, even when the heat-sensitive mask layer is formed as the thin film, no unevenness is generated in the optical density in transmission.

Best Mode for Carrying Out the Invention

The CTP flexographic printing original plate of the present invention is characterized in that, it has a constitution wherein at least a support, a photosensitive resin layer and a heat-sensitive mask layer are sequentially layered, and that two kinds of polyamide resins which are methoxymethylated polyamide resin (A) having a specific low glass transition point (Tg) and a water-soluble polyamide resin (B) containing a basic nitrogen atom in a molecule are used in combination as the binder polymers for the heat-sensitive mask layer.

The support to be used for the printing original plate of the present invention is preferably made from a material being flexible and having a superior dimension stability. Examples thereof include: a support made of metal, such as steel and aluminum, and a support made of a thermoplastic resin, such as a polyethylene terephthalate film, a polybutylene terephthalate film and a polyethylene naphthalate film. Among these, the polyethylene terephthalate film, which has the superior dimension stability and a sufficiently high viscoelasticity, is in particular preferably used. A thickness of the support is set to 50 to 350 μm, preferably, to 100 to 250 μm, from viewpoints of mechanical properties, shape stability and handling characteristics during production of a printing plate. Moreover, if necessary, an adhesive layer may be formed in order to improve an adhesive property between the support and a photosensitive resin layer.

The photosensitive resin layer used for the printing original plate of the present invention is constituted from essential components which are synthetic polymer compound, photopolymerizable unsaturated compound and photopolymerization initiator, and an optional additive such as plasticizer, thermal polymerization presenter, dye, pigment, ultraviolet absorber, fragrance or antioxidant. As to the synthetic polymer compound used for the photosensitive resin layer, it is preferred to contain a polymer prepared from latex.

Examples of the latex usable for obtaining the polymer include: water-dispersible latex polymers, such as polybutadiene latex, natural rubber latex, styrene-butadiene copolymer latex, acrylonitrile-butadiene copolymer latex, polychloroprene latex, polyisoprene latex, polyurethane latex, methylmethacrylate-butadiene copolymer latex, vinylpyridine polymer latex, butyl polymer latex, thiokol polymer latex and acrylate polymer latex; and polymers obtained by copolymerizing another component, such as acrylic acid and methacrylic acid, therewith. Among these, water-dispersible latex polymers having a butadiene skeleton or an isoprene skeleton in molecular chains are preferably used from viewpoints of hardness and rubber elasticity. More specifically, polybutadiene latex, styrene-butadiene copolymer latex, acrylonitrile-butadiene copolymer latex, methylmethacrylate-butadiene copolymer latex and polyisoprene latex are preferably used. The polymer obtained from the latex is preferred to exist as independent fine particles in a hydrophobic component.

The photosensitive resin layer used for the printing original plate of the present invention may also contain a conjugated diene rubber as the synthetic polymer compound within such an extent that it does not lower water-developability. As a result of compounding with the conjugated diene rubber, physical properties of the photosensitive resin layer can be enhanced.

The heat-sensitive mask layer to be used for the printing original plate of the present invention contains carbon black (which is a material having a function of absorbing infrared laser rays to convert them into heat and a function of blocking ultraviolet rays) and the above two kinds of polyamides as the binder polymers. Further, the heat-sensitive mask layer may contain a dispersing agent for enhancing the dispersibility of carbon black. Furthermore, optional components except for these components, such as a filler, a surfactant or a painting aid, may be contained therein within such an extent that it does not impair the effects of the present invention.

It is preferred that the heat sensitive mask layer of the present invention contains a dispersing agent for enhancing the dispersibility of carbon black. Although the above two kinds of polyamide resins as the binder polymers may be used as the dispersing agent, a separate dispersing agent may be used. In this case, for example, butyral resin, polyvinyl alcohol or modified polyvinyl alcohol may be used. Among the above, butyral resin and modified polyvinyl alcohol are preferred.

Butyral resin which is used as the dispersing agent in the heat-sensitive mask layer of the present invention is also called polyvinyl butyral, and is a kind of polyvinyl acetal which is produced by reacting polyvinyl alcohol with butyl aldehyde using an acid catalyst.

As to the modified polyvinyl alcohol used as the dispersing agent in the heat-sensitive mask layer of the present invention, there is exemplified polyvinyl alcohol which has been modified based on polyvinyl alcohol wherein a degree of saponification is 70% to 90%. The polyvinyl alcohol wherein the degree of saponification is 70% to 90% has a hydroxyl group and can be modified by reacting with the hydroxyl group. As to other modification method, it is also possible to modify by copolymerizing with a polymerizable monomer having a polar group.

With regard to the specific modified polyvinyl alcohol used as the dispersing agent in the heat-sensitive mask layer of the present invention, there are exemplified polyvinyl alcohol into which an anionic polar group or a cationic polar group is introduced, and modified polyvinyl alcohol having a nonionic hydrophilic group such as ethylene oxide. The modified polyvinyl alcohol is preferred to be soluble in alcohol. When selecting an alcohol-soluble one, it is possible to prepare a coating solution for the heat-sensitive mask layer by using a solvent which contains alcohol. As to a method for introducing a carboxyl group into polyvinyl alcohol, there are exemplified a method for reacting with an acid anhydride, a method for reacting with a carboxylic acid compound having an epoxy group, and a method for copolymerizing with a monomer having carboxylic acid. As to a commercially available product, there are exemplified CM-318 of Kuraray and T-350 of Nippon Synthetic Chemical industry. On the other hand, as to a method for introducing the cationic group, there are exemplified a method for copolymerizing with a monomer having a cationic group, and a method for reacting with a cationic group-containing compound having an epoxy group. As to a commercially available product, there are exemplified Gosenex K-434 of Nippon Synthetic Chemical industry etc. wherein a cationic group (quaternary ammonium salt) is introduced into a side chain. On the other hand, as to the modified polyvinyl alcohol having the nonionic hydrophilic group, there is exemplified modified polyvinyl alcohol having a nonionic hydrophilic group of alkylene glycol. Specific examples thereof are nonionic modified polyvinyl alcohol having a hydrophilic ethylene oxide group in a side chain (WO-320R of Nippon Synthetic Chemical Industry) etc.

The heat sensitive-mask layer of the present invention contains two kinds of polyamides which are a methoxymethylated polyamide resin (A) having a specific low glass transition point and a water-soluble polyamide resin (B) containing a basic nitrogen atom in a molecule. Those two kinds of polyamides are film-formable polymers and play a role of binder polymers. In the present invention, due to a fact that the heat-sensitive mask layer contains, as the binder polymers, the methoxymethylated polyamide resin (A) having a specific low glass transition point and the water-soluble polyamide resin (B) containing a basic nitrogen atom in a molecule, it is now possible to effectively prevent generation of cracks in the heat-sensitive mask layer during a handling operation even under a severe low-temperature condition.

The methoxymethylated polyamide resin (A) is such a polyamide resin wherein a methoxymethyl group is bonded to a nitrogen atom in an amide group of the polyamide resin. Generally, the polyamide resin as such can be prepared by reacting a polyamide resin with formaldehyde and methanol. As to the polyamide which can be used as a raw material, there are exemplified Nylon 3, 4, 5, 6, 8, 11, 12, 13, 65, 610, 612, 6/66/610, 11/6/66, 12/6/66 and 13/6/66, polyamide derived from m-xylyienediamine and adipic acid, polyamide derived from trimethyl hexamethylenediamine or isophorone diamine and adipic acid, copolymerized polyamide of ε-caprolactam/adipic acid/hexamethylenediamine/4,4'-diaminodicyclohexylmethane, copolymerized polyamide of ε-caprolactam/adipic acid/hexamethylenediamine/2,4,4'-trimethylhexamethylenediamine, copolymerized polyamide of ε-caprolactam/adipic acid/hexamethylenediamine/isophorone diamine and a polyamide resin containing those components. Among them, Nylon 6, 12, 6/12, 12/6/66 and 6/66/610 are preferred as the polyamide resins which can be the raw material.

As to a method for the methoxymethylation, there is specifically exemplified a method disclosed in Japanese Patent Application Laid-Open (JP-A) No. 252626/85. A methoxymethylated rate can be varied by changing treating conditions such as a temperature of a treating solution, a time period for immersion or a concentration of the treating solution. As a result of appropriately varying the treating conditions as such, the aimed methoxylating rate can be achieved. The methoxymethylated rate in the present invention is such a one wherein a methoxymethylated rate to a total amount of nitrogen atoms in the amide group contained in the polyamide resin molecule is expressed in terms of molar %. The methoxymethylated rate of the polyamide resin can be measured by means of a 13C-NMR measurement at a resonance frequency of 125 MHz. To be more specific, AVANCE-500 which is an NMR device manufactured by BRUKER is used as a measuring device. Incidentally, a method of preparing a measuring solution and measuring conditions are as follows.

After dissolving 200 mg of a sample into 2.7 ml of heavy chloroform, the resulting solution is filled in an NMR tube and subjected to the 13C-NMR measurement. As to a locking solvent, heavy chloroform is used. A waiting time is set to be 0.5 second, an incorporating time is set to be 2 seconds and an integrated frequency is set to be 1024 times.

A glass transition point of the methoxymethylated polyamide resin (A) is 0° C. to 30° C., and preferably 0° C. to 20'C. Since the polyamide resin (A) having such low glass transition point is contained in the heat-sensitive mask layer according to the present invention, less cracks are apt to be generated in the heat-sensitive mask layer during the handling operation even under the severe low-temperature condition of 10° C. or lower. When the glass transition point of the methoxymethylated polyamide resin (A) is lower than the above range, there may be such a risk that scratch is apt to happen depending upon a hardness of the heat-sensitive mask layer. When the glass transition point of the methoxymethylated polyamide resin (A) exceeds the above range, there may be such a risk that cracks are apt to be generated in the heat-sensitive mask layer under the low-temperature condition.

As to a method for controlling the glass transition point of the methoxymethylated polyamide resin (A) within the range of 0° C. to 30° C., there is exemplified a method wherein the methoxymethylated rate is changed during a step for methoxymethylating a material polyamide resin having a glass transition point of higher than 30° C. To be more specific, when the methoxymethylated rate is increased, hydrogen bonds between polyamide molecules can be decreased whereby the glass transition point can be lowered.

The methoxymethylated polyamide resin (A) is preferred to be soluble in alcohol. When an alcohol-soluble binder is compounded as the binder polymer in the heat-sensitive mask layer in a high compounding rate, it is now possible to obtain good coat layers wherein neither dissolution nor mixing occurs among the coat layers even it a water-soluble coating solution is applied onto the heat-sensitive mask layer.

The term reading "water-soluble" in the present invention means a property of being soluble or dispersible in water. For example, it means such a case that, when a polyamide resin made into a filmy shape is immersed in water of from room temperature to 40° C. followed by rubbing with a brush or the like, the polymer is wholly or partially eluted or is swollen/scattered and is then dispersed in water whereby the film decreases in its weight or disintegrates.

Further, the term reading "alcohol-soluble" in the present invention means a property of being soluble in a mixed solvent wherein methanol or ethanol as a sole or as a main solvent is mixed with not more than 30% by weight of water, toluene, xylene, ethyl acetate or the like. As to the alcohol-soluble polymer, it is preferred to use such a resin which dissolves upon being immersed in ethanol of 25° C. for 1 hour after making into a film of 0.5 mm thickness or, even if it does not dissolve, it is swollen with 200% by weight or more of ethanol to the polymer. Here, a polymer having both water-soluble and alcohol soluble properties is classified into a water-soluble one.

It is preferred in view of the solubility in alcohol that the methoxymethylated polyamide resin (A) is an aliphatic polyamide resin. As to the methoxymethylated ratio, polyamide resin wherein 15 to 45 molar % of nitrogen atoms are substituted with methoxymethyl group is preferably used. When the methoxymethylated ratio is less than the above range, solubility in alcohol lowers and it is not preferred. On the contrary, when the methoxymethylated ratio exceeds the above range, hardness of the heat-sensitive mask layer lowers due to a decrease in crystallinity resulting in a lowering of scratch resistance whereby it is not preferred.

The methoxymethylated polyamide resin used in the present invention may also be a polyamide into which a hydrophilic group is introduced. As a result of the introduction of the hydrophilic group, the methoxymethylated polyimide resin can be modified.

As to a method of introducing the hydrophilic group into the methoxymethylated polyamide resin, it is preferred to use a method by a reaction of the methoxymethylated polyamide resin with a compound having the hydrophilic group. As to the hydrophilic group, it is preferred to use hydroxyl group, carboxyl group, amino group, etc. To be more specific, there is exemplified a method wherein a vinyl monomer having the hydrophilic group is subjected to a graft polymerization in the presence of the methoxymethylated polyamide resin as shown in Japanese Patent Application Laid-Open (JP-A) No. 245534/85.

The water-soluble polyamide resin (B) containing a basic nitrogen atom in a molecule is a polyamide resin having a basic nitrogen atom in a part of a main chain or a side chain. The basic nitrogen atom is a nitrogen atom constituting an amino group which is not an amide group. As to the polyamide as such, a polyamide having a tertiary nitrogen atom in the main chain is preferred. As to the water-soluble polyamide resin (B) containing a basic nitrogen atom in a molecule, there is exemplified a polyamide which is prepared by copolymerization using a diamine component such as diamine having a piperazine ring, or diamine containing the tertiary nitrogen atom such as methylimino bispropylamine. The polyamide resin (B) is preferred to be soluble in water. It is particularly preferred, in view of the water solubility, to use diamine having a piperazine ring. As to the diamine having a piperazine ring, there are exemplified 1,4-bis(3-aminoethyl)piperazine, 1,4-bis(3-aminopropyl) piperazine and N-(2-aminoethyl)-piperazine. Further, it is also possible, in view of physical properties, to copolymerize the water-soluble polyamide resin (B) containing a basic nitrogen atom in a molecule by partially using diamine, dicarboxylic acid, aminocarboxylic acid or the like containing no basic nitrogen atom other than the above-mentioned material containing the basic nitrogen atom. Incidentally, in the present invention, the methoxymethylated polyamide resin is not covered by the water-soluble polyamide resin (B) containing a basic nitrogen atom in a molecule.

The water-soluble polyamide resin (B) containing a basic nitrogen atom in a molecule plays a role of imparting water solubility or water dispersibility to the heat-sensitive mask layer and also of imparting appropriate hardness to the heat-sensitive mask layer. Therefore, a glass transition point of the water-soluble polyamide resin (B) containing a basic nitrogen atom in a molecule is preferably 30° C. to 60° C. When the glass transition point of the water-soluble polyamide resin (B) containing a basic nitrogen atom in a molecule is lower than the above range, there may be such a risk that the appropriate hardness cannot be applied to the heat-sensitive mask layer. When the glass transition point of the water-soluble polyamide resin (B) containing a basic nitrogen atom in a molecule exceeds the above range, there may be such a risk that cracks are apt to be generated in the heat-sensitive mask layer under the low-temperature condition.

A rate of the methoxymethylated polyamide resin (A) contained in the heat-sensitive mask layer to the water-soluble polyamide resin (B) containing a basic nitrogen atom in a molecule is preferred to be within a range of from 40/60 to 90/10, and more preferred to be within a range of from 40/60 to 80/20 terms of a ratio by mass of [polyamide resin (A)]/[polyamide resin (B)]. When the rate of the methoxymethylated polyamide resin (A) is small, it is not preferred since cracks are apt to be generated in the heat-sensitive mask during the handling operation under the low-temperature condition. When the rate of the methoxymethylated polyamide resin (A) is large, a compounding amount of the water-soluble polyamide resin (B) containing a basic nitrogen atom in a molecule becomes small and the water-developability lowers whereby it is not preferred. Incidentally, it is general that a compounding rate of carbon black in the heat-sensitive mask layer is 30 to 50% by mass, that a compounding rate of a binder polymer therein is 30 to 50% by mass and that a compounding rate of a dispersing agent for carbon black therein is 10 to 40% by mass.

In the CTP flexographic printing original plat of the present invention, a barrier layer may be arranged between the photosensitive resin layer and the heat-sensitive mask layer. As a result of arrangement of the barrier layer, it is possible to suppress a disturbance of polymerization by oxygen, and a transfer of a low molecular component in the photosensitive resin composition to the heat-sensitive mask layer. As to the binder polymer in the barrier layer, there are exemplified polyvinyl alcohol, partially saponified vinyl acetate, alkyl cellulose and cellulose polymer. With regard to those polymers, a use thereof is not limited to only one of them but it is also possible that two or more types of polymers can be used in combination. Binder polymers being preferred in view of the oxygen barrier property are polyvinyl alcohol, partially saponified vinyl acetate and alkyl cellulose. As a result of selecting the binder polymer which exhibits the oxygen barrier property within a preferred range, it is now possible to control an image reproducibility.

With regard to a layer thickness of the barrier layer, it is preferred to be 0.2 µm to 3 µm and more preferred to be 0.2 µm to 1.5 µm. When it is less than the above range, the oxygen barrier property may become insufficient and roughness may be resulted on a plate surface of a relief. When it exceeds the above range, poor reproduction of fine lines may happen.

Although there is no particular limitation for a method for producing the CTP flexographic printing original plate of the present invention, the plate is usually produced as mentioned below. Thus, the components constituting the heat-sensitive mask layer (such as a binder) other than carbon black are dissolved in a suitable solvent and then carbon black is dispersed therein to prepare a dispersion. Then the dispersion as such is applied onto a support (such as a polyethylene terephthalate film) for the heat-sensitive mask layer. Then the solvent is evaporated therefrom. After that, a component for the barrier layer is applied thereon if necessary whereupon one laminate is prepared. Further, apart therefrom, the photosensitive resin layer is formed on another support by means of application whereupon another laminate is prepared. The two laminates prepared as such are layered under pressurization and/or heating in such a manner that the photosensitive resin layer adjacently contacts a protective layer. Incidentally, after completion of the printing original plate, the support for the heat-sensitive mask layer functions as a protective film for a surface thereof.

Now, a method for producing a printing plate from the CTP flexographic printing original plate of the present invention will be explained. When the protective film present, the protective film is firstly removed from the photosensitive printing original plate. Thereafter, the heat-sensitive mask layer is imagewise-irradiated with an IR laser so that a mask is formed on the photosensitive resin layer. Preferable examples of the IR laser include an ND/YAG laser (1064 nm) and a diode laser (for example, 830 nm). A laser system appropriate for the Computer to Plate Technique is commercially available, and, for example, CDI Spark (manufactured by Esko-Graphics Co., Ltd.) may be used. This laser system includes a rotation cylinder drum used for holding a printing original plate, an IR laser irradiating device and a layout computer. Image information is directly transferred from the layout computer to the laser device.

After the image information has been written in the heat-sensitive mask layer, active light rays are applied onto an entire surface of the photosensitive printing original plate via the mask. This process may be carried out with the plate attached to the laser cylinder; however, a method is generally used in which, after the plate has been removed from the laser device, the irradiation process is carried out by using a commonly-used irradiation unit having a flat plate shape because this method is more advantageous in that even a plate size out of the standard can be appropriately handled. Examples of the active light rays include: ultraviolet rays having a wavelength in a range from 150 to 500 nm, in particular, from 300 to 400 mm. Examples of its light source include: a low-pressure mercury lamp, a high-pressure mercury lamp, a super-high pressure mercury lamp, a metal halide lamp, a xenon lamp, a zirconium lamp, a carbon arc lamp and an ultraviolet-ray fluorescent lamp. Thereafter, the irradiated plate is developed so that the printing plate is obtained. The developing process can be carried out by using a commonly-used developing unit.

EXAMPLES

The present invention will now be illustrated in more detail by way of the following Examples although the present invention is not limited thereto. In Examples (the main text), the term "part(s)" stands for part(s) by mass. Incidentally, evaluation of characteristic values in Examples was conducted in accordance with the following methods.

Hereinafter, materials used in each Example will be explained.

Methoxymethylated Polyamide Resin (A)

A-1: As to the methoxymethylated polyamide resin (A), FR-301 manufactured by Namariichi was used. This polyamide resin is a polyamide resin wherein a part of amide groups in a ternary copolymerized Nylon containing Nylon 6 was methoxymethylated. Its glass transition point was 0.8° C. and its methoxymethylated rate was 31%.

A-2: As to the methoxymethylated polyamide resin (A), FR-101 manufactured by Namariichi was used. This polyamide resin is a polyamide resin wherein a part of amide groups in Nylon 6 was methoxymethylated. Its glass transition point was 10.3° C. and its methoxymethylated rate was 37%.

A-3: As to the methoxymethylated polyamide resin (A), FR-104 manufactured by Namariichi was used. This polyamide resin is a polyamide resin wherein a part of amide croups it Nylon 6 was methoxymethylated. Its glass transition point was 16.4° C. and its methoxymethylated rate was 37%.

A-4: As to the methoxymethylated polyamide resin (A), FR-105 manufactured by Namariichi was used. This polyamide resin is a polyamide resin wherein a part of amide groups in Nylon 6 was methoxymethylated. Its glass transition point was 19.9° C. and its methoxymethylated rate was 35%.

A-5: An N-methoxymethylated Nylon 6 was synthesized using Nylon 6 manufactured by Toyobo. To be more specific, Nylon 6 was methoxymethylated according to a method disclosed in Japanese Patent Application Laid-Open (JP-A) No. 252626/85 to prepare an N-methoxymethylated Nylon 6 having the methoxymethylated rate of 9%. Glass transition point of the resulting N-methoxymethylated Nylon 6 was 41° C.

A-6: As a polyamide which was not methoxymethylated, there was used a copolymerized polyamide resin (Ultramid-1C manufactured by BASF) consisting of three components which were caprolactam, hexamethylenediamine-adipic acid and p,p'-diaminodicyclohexylmethane-adipic acid. Glass transition point of this polyamide was 69° C.

A-7: An N-methoxymethylated Nylon having the methoxymethylated rate of 40% was synthesized using 612 copolymerized Nylon manufactured by Arkema according to a method disclosed in Japanese Patent Application Laid-Open (JP-A) No. 252626/85. Glass transition point of the resulting N-methoxymethylated Nylon was −5° C.

A-8: An N-methoxymethylated Nylon 6 was synthesized using Nylon 6 manufactured by Toyobo. To be more specific, Nylon 6 was methoxymethylated according to a method disclosed in Japanese Patent Application Laid-Open (JP-A) No. 252626/85 to prepare an N-methoxymethylated Nylon 6 having the methoxymethylated rate of 20%. Glass transition point of the resulting N-methoxymethylated Nylon 6 was 28° C.

Water-Soluble Polyamide Resin (B) Containing a Basic Nitrogen Atom in a Molecule B-1: ε-Caprolactam (520 parts by mass), 400 parts by mass of N,N'-di(γ-aminopropyl)piperazine adipate, 80 parts by mass of 3-bisaminomethylcyclohexane adipate and 100 parts by mass of water were charged into an autoclave. After substituting with nitrogen, the autoclave was tightly closed and gradually heated. Starting from a stage when an inner pressure reached 10 kg/cm$^3$, water was evaporated therefrom until the pressure could no longer be maintained. The pressure was returned to atmospheric within about 2 hours. Then, a reaction was conducted at an atmospheric pressure for 1 hour. The highest temperature for the polymerization reaction was 255° C. As a result, there was obtained a polyamide containing a tertiary nitrogen atom wherein the glass transition point was 42° C. and the specific viscosity was 1.98.

B-2: ε-Caprolactam (90 parts by mass), 910 parts by mass of salt of N-(2-aminoethyl)piperazine, and adipic acid with Nylon and 100 parts by mass of water were charged into an autoclave. After an inner air was substituted with nitrogen, heating was conducted at 200° C. for 1 hour. Then, water was removed to give a water-soluble polyamide resin. The resulting water-soluble polyamide resin vas a polyamide containing a tertiary nitrogen atom wherein the glass transition point was 47° C.

B-3: Similar to A-1, ε-Caprolactam (450 parts by mass) and 550 parts by mass of N,N'-bis(γ-aminopropyl)piperazine adipate were copolymerized. As a result, there was obtained a polyamide containing a tertiary nitrogen atom wherein the glass transition point was 12° C.

B-4: ε-Caprolactam (588 parts by mass, 412 parts by mass of N,N'-bis(γ-aminopropyl)piperazine adipate and 1000 parts by mass of water were charged into an autoclave. After substituting with nitrogen, the autoclave was tightly closed and gradually heated. While maintaining an inner pressure to 0.4 MPa, water was evaporated therefrom. The pressure was returned to atmospheric within about 2 hours. Then, a reaction was conducted at an atmospheric pressure for 1 hour. As a result, there was obtained a polyimide containing a tertiary nitrogen atom wherein the glass transition point was 80° C.

With regard to the glass transition points (Tg) of the methoxymethylated polyamide resin (A) and the water-soluble polyamide resin (B) containing a basic nitrogen atom in a molecule used in Examples, data publicly announced by the manufacturing companies were adopted for a case of the commercially available products while, in a case of the synthesized products, they were measured as shown below. Further, the methoxymethylated rates of the methoxymethylated polyamide resin (A) used in Examples were measured anew as shown below on the basis of the standard methylmethoxylated rate (ca. 30%) being data publicly announced by the manufacturing companies in a case of the commercially available products. In a case of synthesized products, the rates were also measured as follows.

Glass Transition Point

DSC 100 manufactured by TA Instruments was used as a measuring device. A polyamide resin (10.0 mg) was placed in an aluminum pan. It was heated up to 300° C. at a temperature-rising rate of 20° C./minute and, upon reaching 300° C., it was held for 3 minutes. Immediately after that, it was quenched in liquid nitrogen. After that, the temperature was raised up to 300° C. at the temperature-rising rate of 20°/minute. The glass transition point (Tg) was determined as a temperature at a point of an intersection of a base line with a tangent of an inflection point.

Methoxymethylated Rate

The methoxymethylated rate of a polyamide resin was measured by means of a 13C-NMR measurement at a resonance frequency of 125 MHz. To be more specific, AVANCE-500 which is an NMR device manufactured by BRUKER was used as a measuring device. Incidentally, a method of preparing a measuring solution and measuring conditions were as follows. Thus, after dissolving 200 mg of a sample into 2.7 ml of heavy chloroform, the resulting solution was filled in an NMR tube and subjected to the 13C-NMR measurement. As to a locking solvent, heavy chloroform was used. A waiting time was set to be 0.5 second, an incorporating time was set to be 2 seconds and an integrated frequency was set to be 1024 times.

Dispersing Agent for Carbon Black

C-1: BM-5 manufactured by Sekisui Chemical was used as a butyral resin.

C-2: WO-320R manufactured by Nippon Synthetic Chemical Industry was used as a modified polyvinyl alcohol. This modified polyvinyl alcohol is a nonionic specifically modified polyvinyl alcohol and has a hydrophilic ethylene oxide group in a side chain.

Examples 1 to 12 and Comparative Examples 1 to 5

Preparation of an Applying Solution for the Heat-Sensitive Mask Layer

The methoxymethylated polyamide resin (A), the water-soluble polyamide resin (B) containing a basic nitrogen atom in a molecule and the dispersing agent for carbon black were dissolved in a solvent according to a composition (a ratio by weight) mentioned in "heat-sensitive mask layer composition" in Table 1. Then, carbon black was dispersed therein to prepare a dispersion whereupon the applying solution for the heat-sensitive mask layer was prepared.

Preparation of the Heat-Sensitive Mask Layer

The applying solution for the heat-sensitive mask layer was applied using an appropriately selected bar coater to a PET film support (85000 in 100 μm thickness manufactured by Toyobo) wherein a releasing treatment was applied on both sides thereof so as to make a layer thickness 1.5 μm with followed by drying at 120° C. for 5 minutes to prepare the heat-sensitive mask layer.

Preparation of the Photosensitive Resin Composition

An acrylonitrile-butadiene latex (Nipol SX1503 containing 42% of nonvolatile matters; manufactured by Nippon Zeon) (10 parts by mass), 58 parts by mass of a butadiene latex (Nipol LX111NF containing 55% of nonvolatile matters; manufactured by Nippon Zeon), 28 parts by mass of oligobutadiene acrylate (ABU-2S manufactured by Kyoeisha Kagaku), 4 parts by mass of lauryl methacrylate (Light Ester L manufactured by Kyoeisha Kagaku), 4 parts by mass of di methylol tricyclodecane diacrylate, 1 part by mass of a photopolymerization initiator, 0.1 part by mass of hydroquinone monomethyl ether as polymerization inhibitor and 0.1 part by mass of a nonionic surfactant as an other additive were mixed in a container together with 15 parts by mass of toluene. Then, they were kneaded at 105° C. using a pressure kneader. After that, toluene and water were removed therefrom in vacuo to prepare the photosensitive resin composition.

Production of the CTP Flexographic Printing Original Plate

The photosensitive resin composition was arranged onto a PET film support (E5000 in 125 μm thickness manufactured by Toyobo) being applied with a polymerized polyester adhesive to form photosensitive resin layer. After that, the heat-sensitive mask layer was laid on a top thereof in such a manner that a side wherein the heat-sensitive mask layer was formed (i.e. a side which is opposite to a surface of the film support) contacts the photosensitive resin layer. Lamination was conducted at 100° C. using a heat press machine to give the CTP flexographic printing original plate consisting of the PET film support the adhesive layer, the photosensitive resin layer, the heat-sensitive mask layer and the PET protective film (cover film) being subjected to the releasing treatment. A total thickness of the plate was 1.90 mm.

Evaluation of Properties

Properties of each of the heat-sensitive mask layers and the CTP flexographic printing original plate obtained hereinabove were evaluated as follows.

Light-shielding property Optical density of the heat-sensitive mask layer prepared on the PET film support was measured using DM-520 (monochromatic transmission densitometer Manufactured by Dainippon Screen). The light-shielding property was judged according to the following criteria.

∞: Optical density was 2.7 or more
○: Optical density was 2.4 or more and less than 2.7
Δ: Optical density was 2.0 or more and less than 2.4
x: Optical density was less than 2.0

Scratch resistance: The heat-sensitive mask layer formed on the PET film support was cut out into a square of 20 cm×20 cm. On a top of a surface of the layer, another PET film (E5000 in 100 μm thickness manufactured by Toyobo) was laid. While maintaining such a state, rubbing was done for once in each of right and left directions without applying any force. Then, a scratch formed on the surface of the heat-sensitive mask layer was examined under a loupe of 10 magnifications. The scratch resistance was judged according to the following criteria.

○: No scratch
Δ: 1 to 4 scratch(es) of 50 μm or more was/were noted
x: 5 or more scratches of 50 μm or more were noted Water-developability: The heat-sensitive mask layer formed on the PET film support was cut out into a square of 10 cm×10 cm, immersed in water of room temperature to 40° C. and rubbed with a brush or the like. A surface of the heat-sensitive mask layer at that time was observed. The water-developability was judged according to the following criteria.

∞: Elution from the whole surface was confirmed
○: Partial elution or swelling/discretion followed by dispersing into water was confirmed
Δ: No elution but partial swelling/discretion followed by dispersing into water was confirmed
x: Neither whole or partial elution nor swelling/discretion followed by dispersing into water was confirmed Crack resistance: The prepared CTP flexographic printing original plate was cut out into a square of 20 cm×20 cm to prepare a sample for the evaluation. The sample was preserved for 1 hour on a flat desk in a thermostatic chamber kept at 5° C., 10° C. or 25° C. to adjust a state of the sample. After that, the cover sheet of the sample was detached. As a substitute evaluation of an infrared ablation device, the sample was wound around a cylindrical roll (diameter: 200 mm) in such a manner that the heat-sensitive mask layer was arranged as an outside and fixed for 30 minutes. After that, the sample was detached. Then, a surface of the heat-sensitive mask layer of the sample was observed by naked eye. The crack resistance was judged according to the following criteria.

∞: No crack was confirmed in the heat-sensitive mask layer at any of 5° C., 10° C. and 25° C.
○: Although no crack was confirmed at 10° C. and 25° C., some cracks were confirmed in the heat-sensitive mask layer at 5° C.
Δ: Although no crack was confirmed at 25° C., some cracks were confirmed in the heat-sensitive mask layer at 5° C. and 10° C.
x: Some cracks were confirmed in the heat-sensitive mask layer at any of 5° C., 10° C. and 25° C.

Results of those evaluations for the properties are shown in the following Table 1.

TABLE 1

| | | | | Example 1 | Example 2 | Example 3 | Example 4 | Example 5 | Example 6 | Example 7 | Example 8 | Example 9 |
|---|---|---|---|---|---|---|---|---|---|---|---|---|
| Heat-sensitive mask layer composition | Carbon black (% by mass) | | | 35.0 | 35.0 | 35.0 | 35.0 | 35.0 | 35.0 | 35.0 | 35.0 | 35.0 |
| | Polyamide resin (% by mass) | Methoxy-methylated polyamide resin (A) | A-1 | 19.0 | 24.7 | 28.5 | 24.7 | 24.7 | | | | 19.0 |
| | | | A-2 | | | | | | 24.7 | | | |
| | | | A-3 | | | | | | | 19.0 | | |
| | | | A-4 | | | | | | | | 19.0 | |
| | | | A-5 | | | | | | | | | |
| | | | A-6 | | | | | | | | | |
| | | | A-7 | | | | | | | | | |
| | | | A-8 | | | | | | | | | |
| | | Water-soluble polyamide resin (B) containing a basic nitrogen atom in a molecule | B-1 | 19.0 | 13.3 | 9.5 | 13.3 | | 13.3 | 19.0 | 19.0 | |
| | | | B-2 | | | | | 13.3 | | | | |
| | | | B-3 | | | | | | | | | 19.0 |
| | | | B-4 | | | | | | | | | |
| | | (A)/[(A) + (B)] | | 50.0 | 65.0 | 75.0 | 65.0 | 65.0 | 65.0 | 50.0 | 50.0 | 50.0 |

TABLE 1-continued

| | | | | | | | | | | | |
|---|---|---|---|---|---|---|---|---|---|---|---|
| Dispersing agent for carbon black (% by mass) | Butyral resin | C-1 | 27.0 | 27.0 | 27.0 | | 27.0 | 27.0 | 27.0 | 27.0 | 27.0 |
| | Polyvinyl alcohol | C-2 | | | | 27.0 | | | | | |
| Results of evaluation of properties | Light-shielding property | | ○○ | ○○ | ○○ | ○ | ○ | ○○ | ○○ | ○○ | ○ |
| | Scratch resistance | | ○ | ○ | ○ | ○ | ○ | ○ | ○ | ○ | △ |
| | Water-developability | | ○ | ○○ | ○○ | ○ | ○○ | ○ | ○ | ○ | ○○ |
| | Crack resistance | | ○ | ○○ | ○○ | ○○ | ○ | ○ | ○ | ○ | ○ |

| | | | Example 10 | Example 11 | Example 12 | Comparative Example 1 | Comparative Example 2 | Comparative Example 3 | Comparative Example 4 | Comparative Example 5 |
|---|---|---|---|---|---|---|---|---|---|---|
| Heat-sensitive mask layer composition | Carbon black (% by mass) | | 35.0 | 35.0 | 35.0 | 35.0 | 35.0 | 35.0 | 35.0 | 35.0 |
| | Polyamide resin | Methoxy-methylated polyamide resin (A) | A-1 | 19.0 | 33.0 | | | | | 38.0 | |
| | | | A-2 | | | | | | | | |
| | | | A-3 | | | | | | | | |
| | | | A-4 | | | | | | | | |
| | | | A-5 | | | | | | 19.0 | | |
| | | | A-6 | | | | | 19.0 | | | |
| | | | A-7 | | | | | | | | 24.7 |
| | | | A-8 | | | 24.7 | | | | | |
| | Water-soluble polyamide resin (B) containing a basic nitrogen atom in a molecule | | B-1 | | 5.0 | 13.3 | 38.0 | 19.0 | 19.0 | | 13.3 |
| | | | B-2 | | | | | | | | |
| | | | B-3 | | | | | | | | |
| | | | B-4 | 19.0 | | | | | | | |
| | (A)/[(A) + (B)] | | | 50.0 | 86.8 | 65.0 | 0.0 | 50.0 | 50.0 | 100.0 | 65.0 |
| Dispersing agent for carbon black (% by mass) | Butyral resin | C-1 | 27.0 | 27.0 | 27.0 | 27.0 | 27.0 | 27.0 | 27.0 | 27.0 |
| | Polyvinyl alcohol | C-2 | | | | | | | | |
| Results of evaluation of properties | Light-shielding property | | ○ | ○○ | ○ | ○ | ○ | ○ | ○○ | ○ |
| | Scratch resistance | | ○ | ○ | ○ | ○ | ○ | ○ | x | x |
| | Water-developability | | ○○ | ○ | ○○ | ○ | ○ | ○ | ○○ | ○ |
| | Crack resistance | | ○ | ○○ | Δ | x | x | x | ○ | ○ |

As will noted from Table 1, results were good in all terms of the light shielding property, scratch resistance, water-developability and crack resistance in all of Examples 1 to 12 which were within the scope of the present invention. On the contrary, the crack resistance at to and ambient temperatures was inferior in Comparative Example 1 wherein no methoxymethylated polyamide resin (A) was used. In Comparative Examples 2 and 3 wherein the glass transition point of the methoxymethylated polyamide resin (A) was too high, the crack resistance at low and ambient temperatures was inferior. The scratch resistance was inferior in Comparative Example 4 using no water-soluble polyamide resin (B) containing a basic nitrogen atom in a molecule. The scratch resistance was inferior in Comparative Example 5 wherein the glass transition point of the methoxymethylated polyamide resin (A) was too low.

INDUSTRIAL APPLICABILITY

The photosensitive CTP flexographic printing original plate of the present invention has such high performances that, even under the severe low-temperature condition of 10° C. or lower, no crack is generated in the heat-sensitive mask layer and further that, even when being formed as the thin film, no unevenness is generated in the optical density in transmission. Consequently, the photosensitive CTP flexographic printing original plate of the present invention is very suitable for the use under severe handling conditions at low temperatures in wintertime or in cold districts.

The invention claimed is:

1. A photosensitive CTP flexographic printing original plate, characterized in that, it comprises at least a support, a photosensitive resin layer and a heat-sensitive mask layer which are sequentially layered, that the heat-sensitive mask layer contains a methoxymethylated polyamide resin (A) and a water-soluble polyamide resin (B) containing a basic nitrogen atom in a molecule, and that a glass transition point of the polyamide resin (A) is 0° C. to 30° C.

2. The photosensitive CTP flexographic printing original plate according to claim 1, wherein the methoxymethylated polyamide resin (A) is an aliphatic polyamide resin, and wherein a methoxymethylated rate thereof is 15 to 45 molar % to a total amount of nitrogen atoms in an amide group.

3. The photosensitive CTP flexographic printing original plate according to claim 1, wherein a rate of the methoxymethylated polyamide resin (A) to the water-soluble polyamide resin (B) in the heat-sensitive mask layer is within a range of from 40/60 to 90/10 in terms of a ratio by mass of [polyamide resin (A)]/[polyamide resin (B)].

4. The photosensitive CTP flexographic printing original plate according to claim 1, wherein the polyamide resin (B) is a copolymerized polyamide containing a piperazine ring in a molecule, and wherein a glass transition point of the polyamide resin (B) is 30 to 60° C.

* * * * *